United States Patent
Doddavula et al.

(10) Patent No.: US 9,201,916 B2
(45) Date of Patent: Dec. 1, 2015

(54) METHOD, SYSTEM, AND COMPUTER-READABLE MEDIUM FOR PROVIDING A SCALABLE BIO-INFORMATICS SEQUENCE SEARCH ON CLOUD

(75) Inventors: S/shri. Shyam Kumar Doddavula, Bangalore (IN); Madhavi Rani, Bangalore (IN); Anirban Ghosh, Asansol (IN); Akansha Jain, Bangalore (IN); Santonu Sarkar, Bangalore (IN); Mudit Kaushik, Meerut (IN); Harsh Vachhani, Vadodara (IN)

(73) Assignee: Infosys Limited, Bangalore (IN)

( * ) Notice: Subject to any disclaimer, the term of this patent is extended or adjusted under 35 U.S.C. 154(b) by 0 days.

(21) Appl. No.: 13/495,753

(22) Filed: Jun. 13, 2012

(65) Prior Publication Data

US 2013/0339321 A1 Dec. 19, 2013

(51) Int. Cl.
G06F 17/30 (2006.01)
H03M 7/30 (2006.01)

(52) U.S. Cl.
CPC .... *G06F 17/30321* (2013.01); *G06F 17/30584* (2013.01); *G06F 17/30067* (2013.01); *H03M 7/30* (2013.01)

(58) Field of Classification Search
CPC .............. H03M 7/30; G06F 17/30067; G06F 17/30595; G06F 17/30321; G06F 17/30584
USPC ................... 707/693, 737, E17.002, E17.014
See application file for complete search history.

(56) References Cited

U.S. PATENT DOCUMENTS

| | | | | |
|---|---|---|---|---|
| 5,710,915 | A * | 1/1998 | McElhiney | 1/1 |
| 6,633,817 | B1 * | 10/2003 | Walker et al. | 702/19 |
| 6,691,045 | B1 * | 2/2004 | Labute | 702/27 |
| 6,741,983 | B1 * | 5/2004 | Birdwell et al. | 1/1 |
| 6,922,638 | B1 * | 7/2005 | Wallace et al. | 702/19 |
| 6,983,274 | B2 * | 1/2006 | Patzer | 1/1 |
| 7,058,634 | B2 * | 6/2006 | Potts et al. | 1/1 |
| 7,272,612 | B2 * | 9/2007 | Birdwell et al. | 1/1 |
| 7,769,803 | B2 * | 8/2010 | Birdwell et al. | 709/201 |
| 8,032,310 | B2 * | 10/2011 | Stenger et al. | 702/20 |
| 8,126,874 | B2 * | 2/2012 | Sercinoglu et al. | 707/721 |
| 8,340,914 | B2 * | 12/2012 | Gatewood et al. | 702/19 |
| 8,660,129 | B1 * | 2/2014 | Brendel et al. | 370/397 |

(Continued)

FOREIGN PATENT DOCUMENTS

KR 20040036691 * 4/2004 ............. G06F 17/30

OTHER PUBLICATIONS

O'Connor et al., "SeqWare Query Engine: storing and searching sequence data in the cloud", in the 11th Annual Bioinformatics Open Source Conference (BOSC), Jul. 2010, 9 pages.*

(Continued)

*Primary Examiner* — Phuong Thao Cao
(74) *Attorney, Agent, or Firm* — LeClairRyan, a Professional Corporation

(57) ABSTRACT

The present invention relates to a computer-implemented method, system and computer readable medium for providing a scalable bio-informatics sequence search on cloud. The method comprises the steps of partitioning a genome data into a plurality of datasets and storing the plurality of data sets in a database. Receiving at least one sequence search request input and searching for a genome sequence in the database corresponding to the search request input and scaling of the sequence search based on the sequence search request input.

21 Claims, 5 Drawing Sheets

(56) References Cited

U.S. PATENT DOCUMENTS

| | | | | |
|---|---|---|---|---|
| 2002/0152191 A1* | 10/2002 | Hollenberg et al. | | 707/1 |
| 2002/0194173 A1* | 12/2002 | Bjornson et al. | | 707/4 |
| 2003/0041053 A1* | 2/2003 | Roth | | 707/3 |
| 2003/0105594 A1* | 6/2003 | Westbrook et al. | | 702/19 |
| 2003/0120429 A1* | 6/2003 | Li et al. | | 702/19 |
| 2003/0144955 A1* | 7/2003 | Kim | | 705/40 |
| 2003/0171876 A1* | 9/2003 | Markowitz et al. | | 702/20 |
| 2003/0210245 A1* | 11/2003 | Mannion et al. | | 345/440 |
| 2004/0018506 A1* | 1/2004 | Koehler et al. | | 435/6 |
| 2004/0024536 A1* | 2/2004 | Rognes | | 702/20 |
| 2004/0098203 A1* | 5/2004 | Rognes | | 702/20 |
| 2004/0186920 A1* | 9/2004 | Birdwell et al. | | 710/1 |
| 2004/0197934 A1* | 10/2004 | Bajorath et al. | | 436/518 |
| 2004/0199533 A1* | 10/2004 | Celis et al. | | 707/101 |
| 2004/0240592 A1* | 12/2004 | Meyer et al. | | 375/343 |
| 2005/0027729 A1* | 2/2005 | Kuchinsky et al. | | 707/100 |
| 2005/0142622 A1* | 6/2005 | Sanders et al. | | 435/7.32 |
| 2005/0149269 A1* | 7/2005 | Thomas et al. | | 702/19 |
| 2006/0046246 A1* | 3/2006 | Zeng et al. | | 435/5 |
| 2006/0088831 A1* | 4/2006 | Szabo et al. | | 435/6 |
| 2007/0055662 A1* | 3/2007 | Edelman et al. | | 707/6 |
| 2007/0156761 A1* | 7/2007 | Smith, III | | 707/104.1 |
| 2007/0208677 A1* | 9/2007 | Goldberg et al. | | 706/13 |
| 2007/0271268 A1* | 11/2007 | Fontoura et al. | | 707/6 |
| 2007/0282537 A1* | 12/2007 | Freitas et al. | | 702/19 |
| 2008/0077607 A1* | 3/2008 | Gatawood et al. | | 707/101 |
| 2008/0133474 A1* | 6/2008 | Hsiao et al. | | 707/3 |
| 2008/0215539 A1* | 9/2008 | Barsness et al. | | 707/2 |
| 2008/0281818 A1* | 11/2008 | Tenenbaum et al. | | 707/6 |
| 2008/0306978 A1* | 12/2008 | Hoernkvist | | 707/101 |
| 2009/0019007 A1* | 1/2009 | Niina | | 707/3 |
| 2009/0049443 A1* | 2/2009 | Powers et al. | | 718/100 |
| 2009/0055361 A1* | 2/2009 | Birdwell et al. | | 707/3 |
| 2009/0282000 A1* | 11/2009 | Bennett | | 707/3 |
| 2010/0001886 A1* | 1/2010 | Bellessort et al. | | 341/51 |
| 2010/0205204 A1* | 8/2010 | Gojobori et al. | | 707/769 |
| 2010/0251329 A1* | 9/2010 | Wei | | 726/1 |
| 2010/0274380 A1* | 10/2010 | Gray | | 700/104 |
| 2010/0291681 A1* | 11/2010 | Khvorova et al. | | 435/440 |
| 2011/0208710 A1* | 8/2011 | Lesavich | | 707/706 |
| 2011/0213765 A1* | 9/2011 | Cui et al. | | 707/711 |
| 2011/0225165 A1* | 9/2011 | Burstein | | 707/741 |
| 2011/0246505 A1* | 10/2011 | Jung | | 707/769 |
| 2011/0258621 A1* | 10/2011 | Kern | | 718/1 |
| 2011/0292792 A1* | 12/2011 | Zuo et al. | | 370/230 |
| 2011/0295858 A1* | 12/2011 | Ahn et al. | | 707/741 |
| 2011/0320536 A1* | 12/2011 | Lobb et al. | | 709/205 |
| 2011/0320681 A1* | 12/2011 | Borntraeger et al. | | 711/6 |
| 2012/0009201 A1* | 1/2012 | Blonder et al. | | 424/158.1 |
| 2012/0041977 A1* | 2/2012 | Kimura | | 707/772 |
| 2012/0072571 A1* | 3/2012 | Orzell et al. | | 709/224 |
| 2012/0075325 A1* | 3/2012 | Kurtyka et al. | | 345/589 |
| 2012/0078948 A1* | 3/2012 | Darcy | | 707/769 |
| 2012/0147958 A1* | 6/2012 | Ronca et al. | | 375/240.16 |
| 2012/0159483 A1* | 6/2012 | He et al. | | 718/1 |
| 2012/0233202 A1* | 9/2012 | Ganeshalingam et al. | | 707/769 |
| 2013/0145367 A1* | 6/2013 | Moss et al. | | 718/1 |
| 2013/0191351 A1* | 7/2013 | Baym et al. | | 707/693 |
| 2013/0227558 A1* | 8/2013 | Du et al. | | 718/1 |
| 2013/0304484 A1* | 11/2013 | Martinez et al. | | 705/2 |
| 2013/0318525 A1* | 11/2013 | Palanisamy et al. | | 718/1 |
| 2013/0332436 A1* | 12/2013 | Camplejohn et al. | | 707/706 |
| 2014/0006244 A1* | 1/2014 | Crowley et al. | | 705/37 |

OTHER PUBLICATIONS

Lin et al., "Efficient Data Access for Parallel BLAST", International Parallel and Distributed Processing Symposium, 2005, 10 pages.*

D. R. Mathog, "Parallel BLAST on Split databases", Bioinformatics Application Note, vol. 19, No. 14, 2003, pp. 1865-1866.*

Rangwala et al., "Massively Parallel BLAST for the Blue Gene/L", In High Availability and Performance Workshop, 2005, 6 pages.*

R.C. Taylor, "An Overview of the Hadoop/MapReduce/HBase Framework and its current applications in bioinformatics", In The 11th Annual Bioinformatics Open Source Conference (BOSC) 2010, Jul. 2010, 6 pages.*

Rekepalli et al., "Petascale Genomic Sequence Search", Mar. 3, 2011, 4 pages, accessed online at <http://neko.bio.utk.edu/~avose/SCALE2011.pdf> on Oct. 10, 2013.*

Chikkagoudar et al., "PLAST-ncRNA: Partition function Local Alignment Search Tool for non-coding RNA sequences", Nucleic Acids Research, 2010, vol. 38, Web Server Issue, published online Jun. 3, 2010, pp. W59-W63 (5 pages).*

Terzo et al., "A Cloud Infrastructure for Optimization of a Massive Parallel Sequencing Workflow", In Proceedings of the 12th IEEE/ACM International Symposium on Cluster, Cloud and Grid Computing, May 13-16, 2012, pp. 678-679.*

Bottoms et al., "IView: Introgression Library Visualization and Query Tool", BMC Bioinformatics 2010, 11(Suppl 6): S28, 6 pages, 2010.*

Ching et al., "Exploring I/O Strategies for Parallel Sequence-Search Tools with S3aSim", In Proceedings of the 15th IEEE International Symposium on High Performance Distributed Computing, IEEE, pp. 229-240, 2006.*

Daugelaite et al., "An Overview of Multiple Sequence Alignments and Cloud Computing in Bioinformatics", Hindawi Publishing Corporation, ISRN Biomathematics, vol. 2013, Article ID 615630, 14 pages, 2013.*

Jiang et al., "An Efficient Parallel Implementation of the Hidden Markov Methods for Genomic Sequence Search on a Massively Parallel System", IEEE Transactions on Parallel and Distributed Systems, vol. 19, No. 1, Jan. 2008, pp. 15-23.*

Lagar-Cavilla et al., "SnowFlock: Rapid Virtual Machine Cloning for Cloud Computing", ACM, EuroSys '09, Apr. 1-3, 2009, Nuremberg, Germany, 12 pages, 2009.*

M. Murata, "Application of PVM to Protein Homology Search", PVM/MPI 2006, LNCS 4192, pp. 410-411, 2006.*

* cited by examiner

METHOD, SYSTEM, AND COMPUTER-READABLE MEDIUM FOR PROVIDING A SCALABLE BIO-INFORMATICS SEQUENCE SEARCH ON CLOUD

FIELD OF THE INVENTION

The invention relates to a method for searching a bio-informatics sequence. More specifically, the invention relates to a computer-implemented method, system and computer readable medium for providing a scalable bio-informatics sequence search on cloud.

BACKGROUND OF THE INVENTION

Bio-informatics Sequence Search is a common task in drug discovery process. BLAST is one of the most widely used next generation sequencing research tools. BLAST performs a sequence similarity search and comparison using heuristic methods. There are challenges in scaling up Sequence Search tools like BLAST to handle large amounts of genome data and large number of concurrent requests while providing results in reasonable amount of time cost effectively.

Sequence search uses several tools like BLAST, BLAT etc. These tools are similar in architecture but implement different search algorithms. There are solutions that describe how to re-implement some of these algorithms like BLAST using frameworks like Map Reduce but it's difficult to re-implement and keep updating them as there are advances in those algorithm implementations. The current invention describes a solution for making sequences search tools faster, secure, cost effective using cloud computing infrastructure and techniques. The current invention uses BLAST as an example to describe the techniques used but they apply to any similar sequence search tool like BLAT.

BLAST is one of the most widely used next generation sequencing research tools. BLAST performs a sequence similarity search and comparison using heuristic methods. The heuristic method tries to create an alignment by finding the amount of local similarity. Identification of this local alignment between two sequences was proposed by Smith-Waterman. The BLAST heuristic finds short matches between two sequences and creates alignments from the matched hot spots. In addition, it also provides statistical data regarding the alignment including the 'expect' value or false-positive rate. Furthermore, the search heuristic also indexes the query and target sequence into words of a chosen size. The FASTA (Pearson and Lipman 1988) and NCBI BLAST mostly use this algorithm to provide fast and flexible alignments involving huge databases.

BLAST can be used in different ways, as standalone application or via web interface for comparison of an input query against a database of sequences. BLAST is a computationally intensive technique, through the computation contains embarrassingly parallel code. To exploit the inherent parallelism present the computation, researchers have made several parallelization attempts in order to process the massive data faster. For example, Soap-HT-BLAST, MPIBLAST, GridBLAST, WNDBLAST, Squid, ScalaBlast, GridWorm use an infrastructure model that focuses on low-level details such as MPI message-passing libraries or grid frameworks like Globus. However, their installation as well as maintenance is quite complicated. Y. Sun et. al. has implemented an ad-hoc grid solution of BLAST where the computation does not take place where the data resides. M. Gaggero et. al has used the core GSEA algorithm for parallel implementation of BLAST on top of Hadoop. BlastReduce, a parallel read mapping algorithm implemented on Java with Hadoop. which uses the Landauvishkin algorithm (seed and extend alignment algorithm) to optimize mapping of short reads. Twister BLAST is a parallel BLAST application based on Twister MapReduce framework. Yet another implementation called Biodoop, uses three algorithms BLAST, GSEA and GRAMMAR. CloudBlast is another popular implementation of BLAST that uses hadoop map-reduce framework for supporting BLAST on cloud platform and has been proved to give better performance over MPIBLAST. Azure BLAST is similar to Cloud Blast in computing style but supported by Azure Cloud Platform rather than Map-Reduce. Blast has also been ported on EC2-taskFarmer, Franklin-taskFarmer, and EC2-Hadoop. Blast has also been parallelized at the hardware level. The first hardware BLAST accelerator was reported by R. K. Singh. TimeLogic has commercialized an FPGA-based accelerator called the DeCypher BLAST hardware accelerator.

Ensembl is a joint project between EMBL-EBI and the Sanger Centre. Ensembl produces genome databases for vertebrates and other eukaryotic species and provides a web based solution for searching the genome sequences leveraging BLAST algorithm. Ensembl doesn't offer security for the search operations. Several pharmaceutical organizations are not able to use the sequence search services offered by Ensembl because they are concerned that their competitors will be able to eavesdrop on the sequence searches being performed by their scientists leading to loss of proprietary and confidential information. Another challenge with use of Ensembl is the performance is not predictable. As the number of concurrent requests increase, the sequence search operations performed through the Ensembl web application take more time leading to loss of productive time of the scientists thus resulting in delays of the drug discovery process and the consequential loss of revenues. The alternative for this is to host a mirror of Ensembl internally but that is not cost effective.

The existing sequence search solutions are not scalable, not cost effective, do not provide adequate security and features like public-private data interlinking for use in large pharmaceutical companies. The present technologies leverage a constant pool of infrastructure irrespective of the workloads.

Thus, there is a need to overcome the problems of the existing technologies. Therefore, the present inventors have developed a computer-implemented method, system and computer readable medium for providing a scalable bio-informatics sequence search on cloud, which would provide scalability, security, interlinking of public and private data sets, applying access controls, efficient partitioning of data and parallelization for faster sequence search processing and cost efficiency problems in bio-informatics sequence search.

SUMMARY OF THE INVENTION

According to one aspect of the invention there is provided a computer implemented method executed by one or more computing devices for providing a scalable bio-informatics sequence search on cloud. The method comprises the steps of partitioning a genome data into a plurality of datasets and storing the plurality of data sets in a database. Receiving at least one sequence search request input and searching for a genome sequence in the database corresponding to the search request input and scaling of the sequence search based on the sequence search request input.

According to another aspect of the invention there is provided a system for providing a scalable bio-informatics sequence search on cloud. The system comprises a memory and a processor operatively coupled to the memory. The processor configured to perform the steps of partitioning a genome data into a plurality of datasets and storing the plurality of data sets in a database. Receiving at least one sequence search request input and searching for a genome sequence in the database corresponding to the search request input and scaling of the sequence search based on the sequence search request input.

According to another aspect of the invention there is provided a computer-readable code stored on a non-transitory computer-readable medium that, when executed by a computing device, performs a method for providing a scalable bio-informatics sequence search on cloud. The method comprises the steps of partitioning a genome data into a plurality of datasets and storing the plurality of data sets in a database. Receiving at least one sequence search request input and searching for a genome sequence in the database corresponding to the search request input and scaling of the sequence search based on the sequence search request input.

BRIEF DESCRIPTION OF THE DRAWINGS

Features, aspects, and advantages of the present invention will be better understood when the following detailed description is read with reference to the accompanying drawings in which like characters represent like parts throughout the drawings, wherein.

DETAILED DESCRIPTION OF THE INVENTION

While system and method are described herein by way of example and embodiments, those skilled in the art recognize that system and method for providing a scalable bio-informatics sequence search on cloud are not limited to the embodiments or drawings described. It should be understood that the drawings and description are not intended to be limiting to the particular form disclosed. Rather, the intention is to cover all modifications, equivalents and alternatives falling within the spirit and scope of the appended claims. Any headings used herein are for organizational purposes only and are not meant to limit the scope of the description or the claims. As used herein, the word "may" is used in a permissive sense (i.e., meaning having the potential to) rather than the mandatory sense (i.e., meaning must). Similarly, the words "include", "including", and "includes" mean including, but not limited to.

The following description is full and informative description of the best method and system presently contemplated for carrying out the present invention which is known to the inventors at the time of filing the patent application. Of course, many modifications and adaptations will be apparent to those skilled in the relevant arts in view of the following description in view of the accompanying drawings and the appended claims. While the system and method described herein are provided with a certain degree of specificity, the present technique may be implemented with either greater or lesser specificity, depending on the needs of the user. Further, some of the features of the present technique may be used to advantage without the corresponding use of other features described in the following paragraphs. As such, the present description should be considered as merely illustrative of the principles of the present technique and not in limitation thereof, since the present technique is defined solely by the claims.

As a preliminary matter, the definition of the term "or" for the purpose of the following discussion and the appended claims is intended to be an inclusive "or" That is, the term "or" is not intended to differentiate between two mutually exclusive alternatives. Rather, the term "or" when employed as a conjunction between two elements is defined as including one element by itself, the other element itself, and combinations and permutations of the elements. For example, a discussion or recitation employing the terminology "A" or "B" includes: "A" by itself, "B" by itself and any combination thereof, such as "AB" and/or "BA." It is worth noting that the present discussion relates to exemplary embodiments, and the appended claims should not be limited to the embodiments discussed herein.

Figure 1:
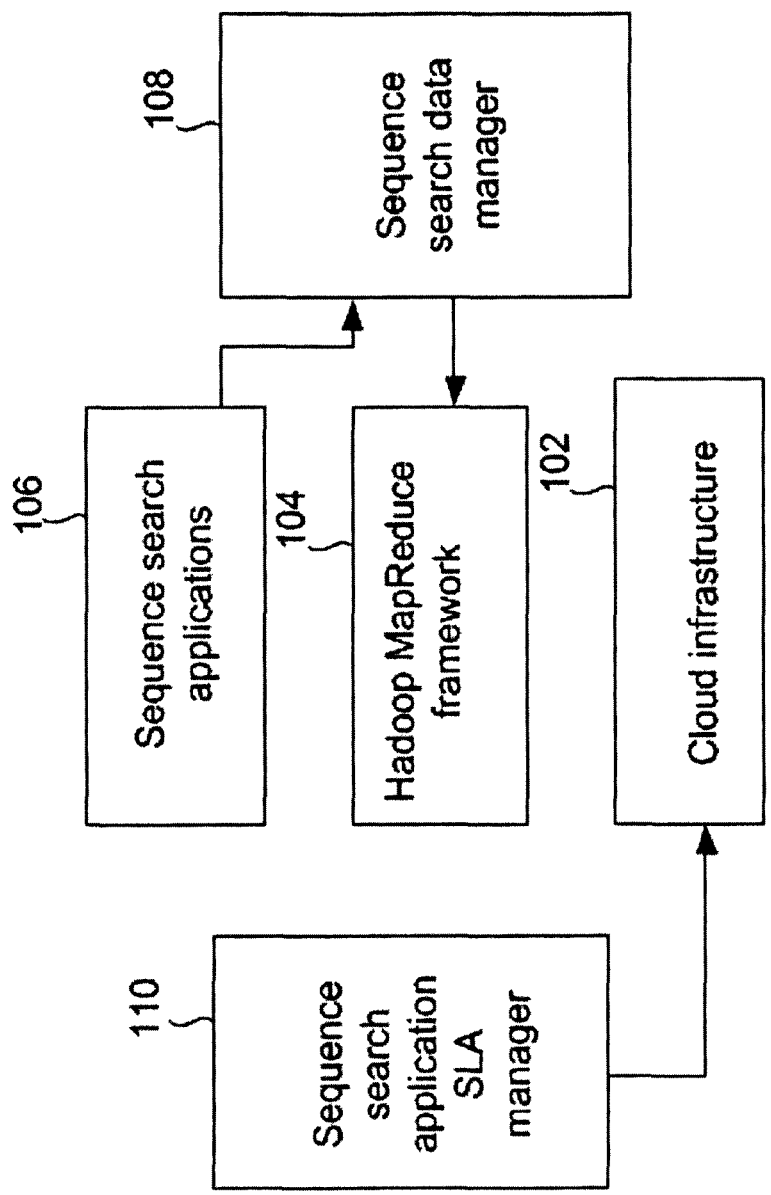
FIG. 1 shows a cloud based sequence service solution architecture.

FIG. 1 shows a cloud based sequence service solution architecture. The solution consists of the modules such as Cloud Infrastructure module (102), Hadoop MapReduce Framework and infrastructure module (104), Sequence Search Applications module (106), Sequence Search Data Manager Module (108) and Sequence Search Application SLA Manager module (110).

The cloud Infrastructure module (102) provides a provisioning manager component that provides the API to dynamically create new Virtual Machines, attach storage and also to increase or decrease the resource allocation to existing virtual machines.

The Hadoop MapReduce module (104) provides the framework for splitting the sequence search job into multiple tasks that can be executed in parallel so that the job can be completed faster. Hadoop Streaming API is used to enable plugging in the BLAST implementations.

The Sequence Search Applications module (106) provides the framework for providing a GUI and Web Services API enabling end-users to perform sequence functions. It includes several components like the BLAST Request Processor that co-ordinates the request processing leveraging several other components. The BLAST Distributed Processing Manager enables parallelization of the processing across multiple servers. The BLAST Data Partition Selector enables selecting the appropriate data partitions and in applying access controls. The Data Aliasing framework enables inter-linking public data sets with private datasets.

The Sequence Search Data Manager module (108) receives the genome data for the different species, partitions the data appropriately, distributes and stores the data across the hadoop data nodes. It also takes care of data security aspects like enforcing access controls to data and encrypting the data at rest.

The Sequence Search Application SLA Manager module (110) monitors the application workloads and the response times and accordingly adds or removes infrastructure using cloud provisioning manager based on automated rules.

Figure 2:
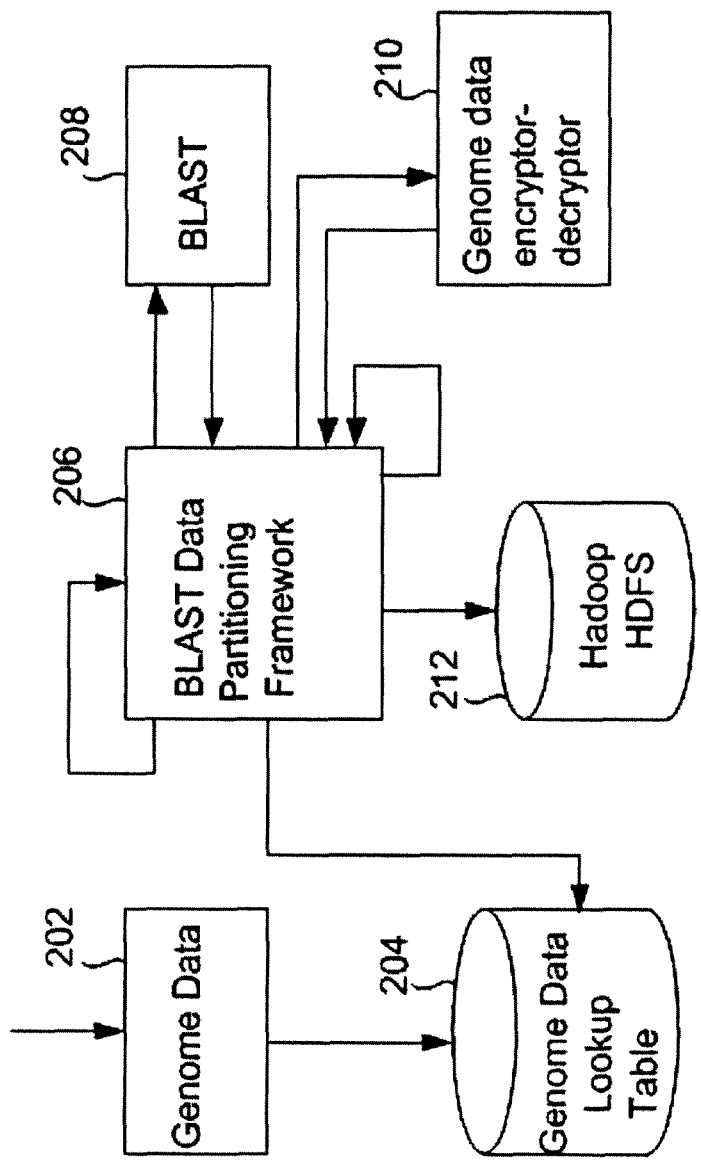
FIG. 2 shows a method for data partitioning.

FIG. 2 shows a method for data partitioning. The steps involved in data partitioning are 1) Receive and Update Genome Data 2) Partition Data 3) Pre-process and create index files 4) Merge and Encrypt and 5) Store Data.

Step 1—Receive and Update Genome Data:

Receive the Genome Data: In this step the genome data (202) is received for partitioning by the Genome Data Uploader component and stored locally.

Update Lookup Table with Species Mapping: In this step the data lookup tables (204) and the access control tables are updated with information regarding the species and the corresponding data sets information like the name/identifier, location where it is stored etc by the Genome Data Uploader component.

Step 2—Partition Data:

Partition data into multiple datasets: In this step the input genome data (202) is split into multiple partitions by the Data Partitioning Component. The size of partition is determined so that the time it takes to process an individual chunk is significantly more than the overhead of managing the processing across multiple chunks. While partitioning the data, the location of split is chosen to match genome boundaries as otherwise it will lead to unusable chunks.

Step 3—Pre-Process and Create Index Files:

Pre-Process Genome Data: In this step the genome data in FASTA file (.fa) is provided to the BLAST (208) executable to pre-process and create index files that will be used later while performing search operations using BLAST (208) so that it is faster.

Create Index Files: In this step the BLAST executable pre-processes the raw genome data in the FASTA file format and provides a set of index files corresponding to each FASTA files.

Step 4—Merge and Encrypt:

Merge Multiple Index files into one: In this step the multiple index files that correspond to a FASTA file partition are merged into one file using compression techniques like zip or gzip by the Data Partitioning Component.

Submit Files for Encryption: The merged index file in the form of a zip file is then provided to the Genome Data Encryptor-Decryptor component (210).

Encrypt Files: The Genome Data Encryptor-Decryptor component (210) uses file encryption tools and API to encrypt the file and provide the encrypted file back to the BLAST Data Partitioning Component (206).

Step 5—Store Data:

Store Partitioned Data: In this step the Data Partitioning Component uses the Hadoop framework to store the partitioned data files into Hadoop Distributed File System (HDFS) (212). In this process it ensures that a partitioned data file fits into one HDFS data block so that when the Hadoop MapReduce framework is later used to process the data, the tasks can be assigned to the data nodes and the data can be retrieved efficiently.

Update Partition Data Details: In this step the Data Partitioning Component updates the Genome Data Lookup Tables (204) with the details of the partitioned datasets.

Figure 3:
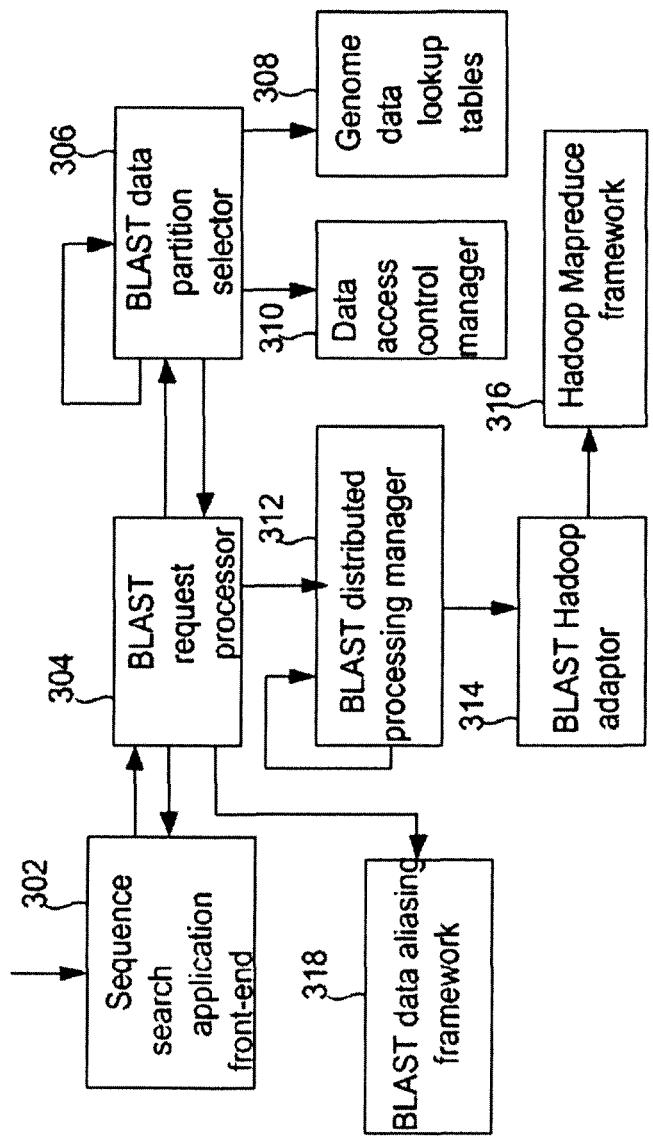
FIG. 3 shows a method for sequence search.

FIG. 3 shows a method for sequence search. The steps involved in sequence search are: 1) Receive Sequence Search Request 2) Identify Data Partitions to search 3) Parallel Processing and 4) Prepare Results Step 1—Receive Sequence Search Request:

Receive Sequence Search Request: In this step the sequence search application front-end (302) receives the sequence request by providing appropriate abstractions to the users.

Submit Sequence Search Request: In this step, user's sequence search request inputs are submitted to the BLAST Request Processor (304).

Step 2—Identify Data Partitions to Search:

Submit BLAST Search Request Inputs: In this step, the BLAST search request inputs are provided to the BLAST Data Partition Selector component (306).

Identify Datasets: In this step, BLAST Data Partition Selector component (306) uses the users inputs like species name, chromosome number, gene of Interest, Special DNA Repeat Fingerprints, Transcription Factors or Disease Indication Targets identify the datasets to be used for the search processing Lookup Partitions: In this step, BLAST Data Partition Selector (306) uses the Genome Data Lookup Tables (308) to identify the appropriate data partitions and their locations in Hadoop Distributed File System.

Apply Access Controls: In this step, BLAST Data Partition Selector (306) uses the Data Access Control component (310) to filter the appropriate datasets Return BLAST Search Data Partitions: In this step the BLAST Data Partition Selector (306) sends the list of data partitions to the BLAST Request Processor (304).

Step 3—Parallel Processing:

Receive Parallelization Request: In the step the BLAST Distributed Processing Manager (312) receives the request for parallelization of BLAST Search Request Create Parallel Jobs: In this step, BLAST Distributed Processing Manager (312) creates the series of jobs and distributes the data partitions that each job has to process. The distribution is driven by rules like the number of data partitions, the number of processing nodes available at the time etc.

Execute Parallel Jobs: In this step the BLAST Distributed Processing Manager (312) uses the BLAST Hadoop Adaptor (314) to execute the jobs in Hadoop Map reduce Framework (316). It uses Hadoop Streaming API to enable plugging in the BLAST executables to be used for processing and the Hadoop Adaptor also provides the logic for retrieving the data from Hadoop Distributed File System and making it available to the BLAST executables in that format that is needed. It takes care of decryption, de-compression of the merged index files into the format that are needed for the BLAST executables. Use of Hadoop Map Reduce framework (316) and the partitioning method described hereinabove which ensures that the data for a partition fits into one HDFS data block enables taking the processing task to the Hadoop data node where the HDFS data block is stored so that there is lower overhead of moving data across the network resulting in faster processing time while allowing high scalability through addition of Hadoop data nodes.

Step 4—Prepare Results:

Apply Aliasing: In this step the BLAST Request Processor (304) uses the Data Aliasing framework (318) to provide interlinks of public data sets to the private data sets like providing interlinking of the user's organization specific identifiers to the identifiers used in public domain like NCBI identifiers.

Format BLAST Results: In this step, the BLAST search results are formatted based on user inputs and provided to the Sequence Search App front end (302).

Figure 4:
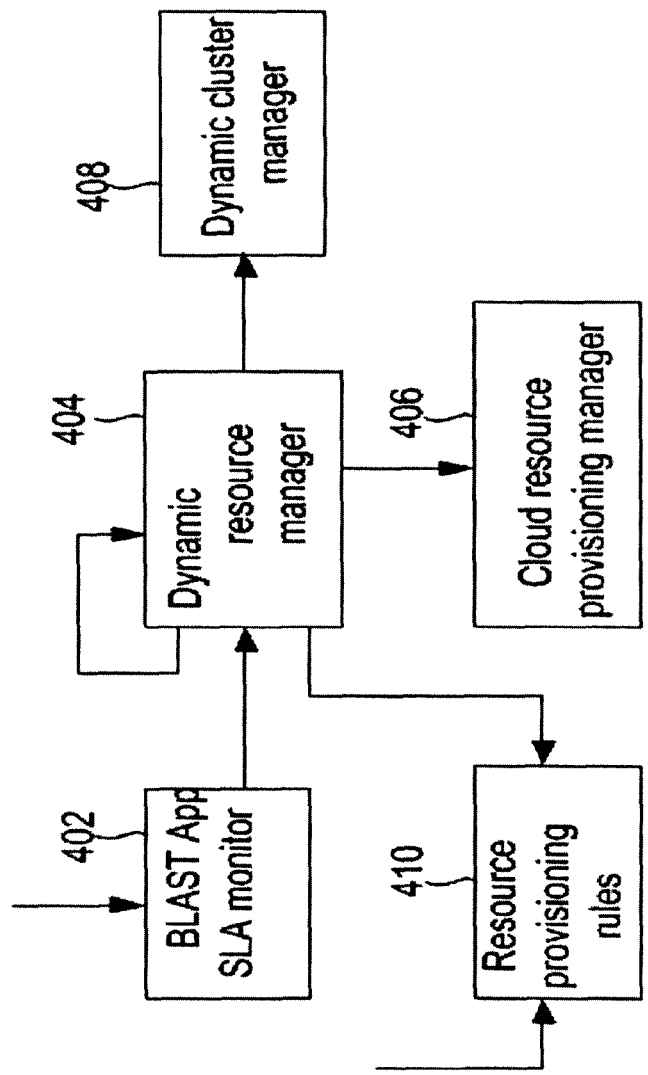
FIG. 4 shows a method for dynamic sequence search application scaling.

FIG. 4 shows a method for dynamic sequence search application scaling. The steps involved in dynamic scaling of the sequence search are 1) Configure and Monitor 2) Apply Dynamic Scaling and 3) Dynamic Scaling.

Step 1—Configure and Monitor:

Configure Monitoring: In this step the BLAST App SLA Monitor component (402) is configured with the SLA parameters to monitor. Example of SLA parameter is the response time to process a BLAST search request.

Configure Provisioning Rules: In this step the Resource Provisioning Rules component is configured with the resource provisioning rules. Example of rule: Increase the number of Hadoop Data Nodes by 1 if the response time to process a BLAST search request is over 2 minutes. These rules are designed to reduce resources allocated when the workload is low and increase resource allocated when the workload goes up. This enables meet SLAs while reducing operating costs.

Monitor SLAs: In this step, the BLAST App SLA Monitor component (402) monitors the BLAST sequence search application for the SLA parameters Get Provisioning Rules: In this step, the Dynamic Resource Manager component (404) gets the provisioning rules configured Step 2—Apply Dynamic Scaling:

Apply Provisioning Rules: In this step the Dynamic Resource Manager component (404) uses the SLA parameter details received from the BLAST App SLA Monitor component (402) and applies the rules it received from the Resource Provisioning Rules component (410). It uses the API provided by the Cloud Resource Provisioning Manager (406) to increase or decrease resource allocations based on the decision arrived at after applying the rules.

Step 3—Dynamic Scaling:

Provision De-Provision Resources: In this step, the Cloud Resource Provisioning Manager (406) adds or removes resources based on the requests it receives from Dynamic Resource Manager component (404).

Update Cluster: In this step, the Dynamic Cluster Manager component (408) updates the Hadoop cluster with the addition or deletion of data nodes.

Exemplary Computing Environment

Figure 5:
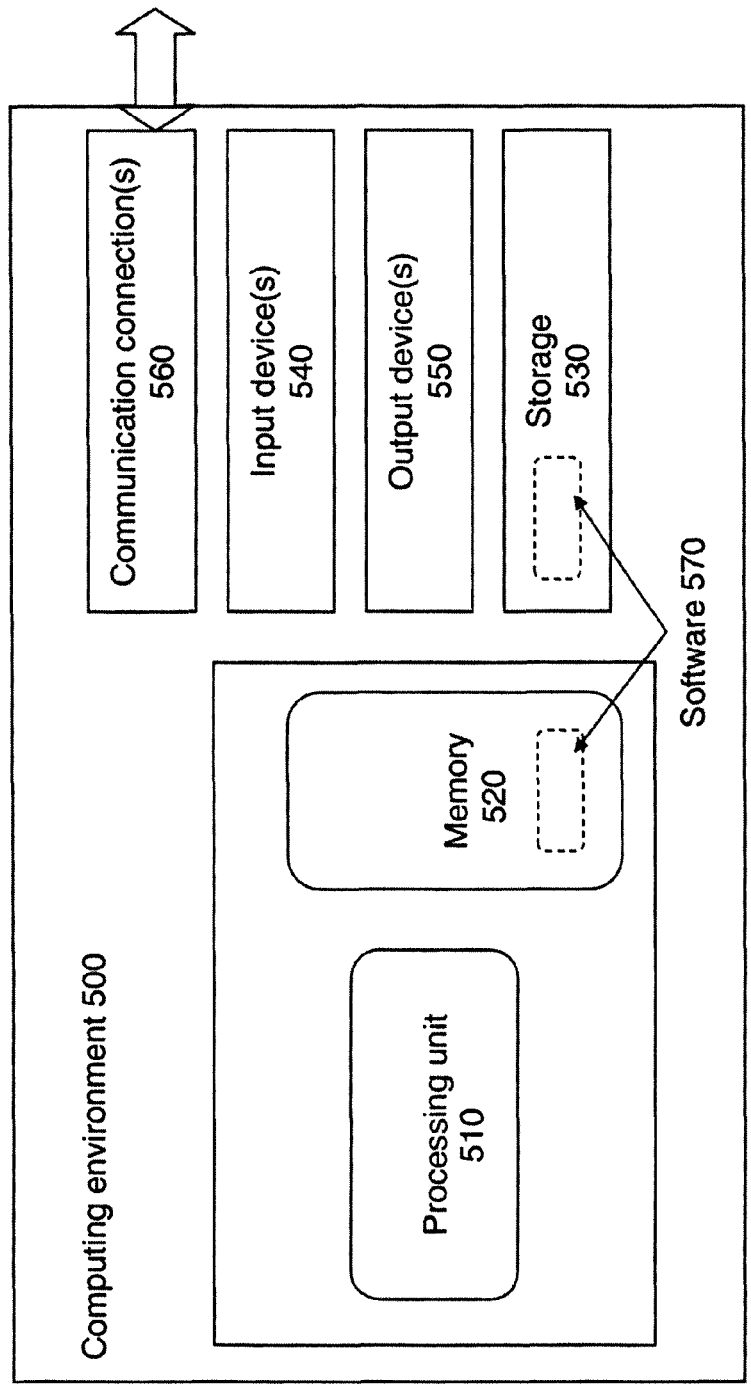
FIG. 5 shows a generalized computer network arrangement, in one embodiment of the present technique.

One or more of the above-described techniques may be implemented in or involve one or more computer systems. FIG. 5 shows a generalized example of a computing environment 500. The computing environment 500 is not intended to suggest any limitation as to scope of use or functionality of described embodiments.

With reference to FIG. 5, the computing environment 500 includes at least one processing unit 510 and memory 520. The processing unit 510 executes computer-executable instructions and may be a real or a virtual processor. In a multi-processing system, multiple processing units execute computer-executable instructions to increase processing power. The memory 520 may be volatile memory (e.g., registers, cache, RAM), non-volatile memory (e.g., ROM, EEPROM, flash memory, etc.), or some combination of the two. In some embodiments, the memory 520 stores software 570 implementing described techniques.

A computing environment may have additional features. For example, the computing environment 500 includes storage 530, one or more input devices 540, one or more output devices 550, and one or more communication connections 560. An interconnection mechanism (not shown) such as a bus, controller, or network interconnects the components of the computing environment 500. Typically, operating system software (not shown) provides an operating environment for other software executing in the computing environment 500, and coordinates activities of the components of the computing environment 500.

The storage 530 may be removable or non-removable, and includes magnetic disks, magnetic tapes or cassettes, CD-ROMs, CD-RWs, DVDs, or any other medium which may be used to store information and which may be accessed within the computing environment 500. In some embodiments, the storage 530 stores instructions for the software 570.

The input device(s) 540 may be a touch input device such as a keyboard, mouse, pen, trackball, touch screen, or game controller, a voice input device, a scanning device, a digital camera, or another device that provides input to the computing environment 500. The output device(s) 550 may be a display, printer, speaker, or another device that provides output from the computing environment 500.

The communication connection(s) 560 enable communication over a communication medium to another computing entity. The communication medium conveys information such as computer-executable instructions, audio or video information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

Implementations may be described in the general context of computer-readable media. Computer-readable media are any available media that may be accessed within a computing environment. By way of example, and not limitation, within the computing environment 500, computer-readable media include memory 520, storage 530, communication media, and combinations of any of the above.

Having described and illustrated the principles of our invention with reference to described embodiments, it will be recognized that the described embodiments may be modified in arrangement and detail without departing from such principles.

In view of the many possible embodiments to which the principles of our invention may be applied, we claim as our invention all such embodiments as may come within the scope and spirit of the claims and equivalents thereto.

While the present invention has been related in terms of the foregoing embodiments, those skilled in the art will recognize that the invention is not limited to the embodiments depicted. The present invention may be practiced with modification and alteration within the spirit and scope of the appended claims. Thus, the description is to be regarded as illustrative instead of restrictive on the present invention.

As will be appreciated by those ordinary skilled in the art, the foregoing example, demonstrations, and method steps may be implemented by suitable code on a processor base system, such as general purpose or special purpose computer. It should also be noted that different implementations of the present technique may perform some or all the steps described herein in different orders or substantially concurrently, that is, in parallel. Furthermore, the functions may be implemented in a variety of programming languages. Such code, as will be appreciated by those of ordinary skilled in the art, may be stored or adapted for storage in one or more tangible machine readable media, such as on memory chips, local or remote hard disks, optical disks or other media, which may be accessed by a processor based system to execute the stored code. Note that the tangible media may comprise paper or another suitable medium upon which the instructions are printed. For instance, the instructions may be electronically captured via optical scanning of the paper or other medium, then compiled, interpreted or otherwise processed in a suitable manner if necessary, and then stored in a computer memory.

The detailed description is presented to enable a person of ordinary skill in the art to make and use the invention and is provided in the context of the requirement for obtaining a patent. The present description is the best presently-contemplated method for carrying out the present invention. Various modifications to the preferred embodiment will be readily apparent to those skilled in the art and the generic principles of the present invention may be applied to other embodiments, and some features of the present invention may be used without the corresponding use of other features. Accordingly, the present invention is not intended to be limited to the embodiment shown but is to be accorded the widest scope consistent with the principles and features described herein.

We claim:

1. A method for providing a scalable bio-informatics sequence search on cloud, the method comprising:
    partitioning, by an information management computing device, genome data into a plurality of datasets and storing the plurality of datasets in a database;
    receiving, by the information management computing device, at least one sequence search request input comprising a species name, a chromosome number, a gene of interest, a special DNA repeat fingerprint, a transcription factor and a disease indication target;
    identifying, by the information management computing device, datasets based on the received at least one sequence search request input;
    searching, by the information management computing device, for a genome sequence in the database corresponding to the identified datasets; and
    scaling up, by the information management computing device, the sequence search to be compatible for execution on a cloud computing platform comprising a plurality of virtual machines based on the received at least one sequence search request input, wherein the scaling up further comprises monitoring at least one service level agreement (SLA) parameter, applying at least one provisioning rule to the monitored at least one SLA parameter, increasing or decreasing a resource allocation upon applying the at least one provisioning rule and updating a Hadoop cluster based on increasing or decreasing the resource allocation.

2. The method as claimed in claim 1, wherein the partitioning of genome data comprises:
    receiving, by the information management computing device, the genome data through a genome data uploader component;
    updating, by the information management computing device, at least one genome data lookup table and at least one access control table by the genome data uploader component;
    partitioning, by the information management computing device, the genome data into the plurality of datasets through a data partitioning component;
    preprocessing, by the information management computing device, the genome data so as to generate a plurality of index files corresponding to each genome data;
    compressing, by the information management computing device, the plurality of index files into a compressed index file;
    encrypting, by the information management computing device, the compressed index file;
    storing, by the information management computing device, partitioned data into a Hadoop distributed file system (HDFS); and
    updating, by the information management computing device, the at least one genome data lookup table through the data partitioning component.

3. The method as claimed in claim 2, wherein the at least one genome data lookup table comprises information of species and a corresponding data set information.

4. The method as claimed in claim 1, wherein the searching for a genome sequence in the database comprises:
    receiving, by the information management computing device, the at least one sequence search request input by a BLAST request processor;
    identifying, by the information management computing device, at least one data partition in the database;
    processing, by the information management computing device, in parallel the at least one sequence search request input and the at least one data partition;
    executing, by the information management computing device, at least one job by using a BLAST Hadoop Adaptor through a BLAST distributed processing manager component; and
    providing, by the information management computing device, at least one result corresponding to the at least one search sequence request input.

5. The method as claimed in claim 4, wherein identifying at least one data partition in the database comprises:
    receiving, by the information management computing device, a BLAST sequence search request input by a BLAST data partition selector component;
    identifying, by the information management computing device, at least one data partition corresponding to the BLAST sequence search request input by using at least one lookup table;
    filtering, by the information management computing device, the at least one data partition by using a data access control component; and
    sending, by the information management computing device, the at least one data partition to the BLAST request processor through the BLAST data partition selector component.

6. The method as claimed in claim 4, wherein the processing in parallel the at least one sequence search request input and the at least one data partition comprises:
    receiving, by the information management computing device, the at least one sequence search request input by the BLAST distributed processing manager component;
    creating, by the information management computing device, at least one parallel job and assigning the created at least one parallel job to the at least one data partition through the BLAST distributed processing manager component; and
    executing, by the information management computing device, the at least one parallel job by using the BLAST Hadoop Adaptor through the BLAST distributed processing manager component.

7. The method as claimed in claim 4, wherein providing at least one result corresponding to the at least one sequence search request input comprises:
    applying, by the information management computing device, a data aliasing framework to provide an interlink of a plurality of public data sets to a plurality of private data sets; and
    formatting, by the information management computing device, at least one result based on the at least one sequence search request input.

8. An information management computing device comprising:
    a memory; and
    a processor operatively coupled to the memory, the processor configured to perform the steps of:
    partitioning genome data into a plurality of datasets and storing the plurality of datasets in a database;
    receiving at least one sequence search request input comprising a species name, a chromosome number, a gene of interest, a special DNA repeat fingerprint, a transcription factor and a disease indication target;
    identifying datasets based on the received at least one sequence search request input;

searching for a genome sequence in the database corresponding to the identified datasets; and scaling up the sequence search to be compatible for execution on a cloud computing platform comprising a plurality of virtual machines based on the received at least one sequence search request input, wherein the scaling up further comprises monitoring at least one service level agreement (SLA) parameter, applying at least one provisioning rule to the monitored at least one SLA parameter, increasing or decreasing a resource allocation upon applying the at least one provisioning rule and updating a Hadoop cluster based on increasing or decreasing the resource allocation.

9. The device of claim 8, wherein the partitioning of genome data comprises:

receiving the genome data through a genome data uploader component;

updating at least one genome data lookup table and at least one access control table by the genome data uploader component;

partitioning the genome data into the plurality of datasets through a data partitioning component;

preprocessing the genome data so as to generate a plurality of index files corresponding to each genome data;

compressing the plurality of index files into a compressed index file;

encrypting the compressed index file;

storing partitioned data into a Hadoop distributed file system (HDFS); and updating the at least one genome data lookup table through the data partitioning component.

10. The device of claim 9, wherein the at least one genome data lookup table comprises information of species and a corresponding data set information.

11. The device of claim 8, wherein the searching for a genome sequence in the database comprises:

receiving the at least one sequence search request input by a BLAST request processor;

identifying at least one data partition in the database;

processing in parallel the at least one sequence search request input and the at least one data partition;

executing at least one job by using a BLAST Hadoop Adaptor through a BLAST distributed processing manager component; and providing at least one result corresponding to the at least one sequence search request input.

12. The device of claim 11, wherein the identifying at least one data partition in the database comprises:

receiving a BLAST search request input by a BLAST data partition selector component;

identifying at least one data partition corresponding to the BLAST search request input by using at least one lookup table;

filtering the identified at least one data partition by using a data access control component; and sending the at least one data partition to the BLAST request processor through the BLAST data partition selector component.

13. The device of claim 11, wherein the processing in parallel the at least one sequence search request input and the at least one data partition comprises:

receiving the at least one sequence search request input by the BLAST distributed processing manager component;

creating at least one parallel job and assigning the created at least one parallel job to the at least one data partition through the BLAST distributed processing manager component; and executing the created at least one parallel job by using the BLAST Hadoop Adaptor through the BLAST distributed processing manager component.

14. The device of claim 11, wherein the providing at least one result corresponding to the at least one sequence search request input comprises:

applying a data aliasing framework to provide an interlink of a plurality of public data sets to a plurality of private data sets; and formatting at least one result based on the at least one sequence search request input.

15. A non-transitory computer readable medium having stored thereon instructions for providing a scalable bio-informatics sequence search on cloud comprising machine executable code which when executed by at least one processor, causes the at least one processor to perform steps comprising:

partitioning genome data into a plurality of datasets and storing the plurality of datasets in a database;

receiving at least one sequence search request input comprising a species name, a chromosome number, a gene of interest, a special DNA repeat fingerprint, a transcription factor and a disease indication target;

identifying datasets based on the received at least one sequence search request input;

searching for a genome sequence in the database corresponding to the identified datasets; and scaling up the sequence search to be compatible for execution on a cloud computing platform comprising a plurality of virtual machines based on the received at least one sequence search request input, wherein the scaling up further comprises monitoring at least one service level agreement (SLA) parameter, applying at least one provisioning rule to the monitored at least one SLA parameter, increasing or decreasing a resource allocation upon applying the at least one provisioning rule and updating a Hadoop cluster based on increasing or decreasing the resource allocation.

16. The medium of claim 15, wherein the partitioning of genome data comprises:

receiving the genome data through a genome data uploader component;

updating at least one genome data lookup table and at least one access control table by the genome data uploader component;

partitioning the genome data into the plurality of datasets through a data partitioning component;

preprocessing the genome data so as to generate a plurality of index files corresponding to each genome data;

compressing the plurality of index files into a compressed index file;

encrypting the compressed index file;

storing partitioned data into a Hadoop distributed file system (HDFS); and updating the at least one genome data lookup table through the data partitioning component.

17. The medium of claim 16, wherein the at least one genome data lookup table comprises information of species and a corresponding data set information.

18. The medium of claim 15, wherein the searching for a genome sequence in the database comprises:

receiving the at least one sequence search request input by a BLAST request processor;

identifying at least one data partition in the database;

processing in parallel the at least one sequence search request input and the at least one data partition;

executing at least one job by using a BLAST Hadoop Adaptor through a BLAST distributed processing manager component; and providing at least one result corresponding to the at least one sequence search request input.

19. The medium of claim 18, wherein the identifying at least one data partition in the database comprises:

receiving a BLAST search request input by a BLAST data partition selector component;

identifying at least one data partition corresponding to the BLAST search request input by using at least one lookup table;

filtering the at least one data partition by using a data access control component; and sending the at least one data partition to the BLAST request processor through the BLAST data partition selector component.

20. The medium of claim 18, wherein the processing in parallel the at least one sequence search request input and the at least one data partition comprises:

receiving the at least one sequence search request input by the BLAST distributed processing manager component;

creating at least one parallel job and assigning the created at least one parallel job to the at least one data partition through the BLAST distributed processing manager component; and executing the created at least one parallel job by using the BLAST Hadoop Adaptor through the BLAST distributed processing manager component.

21. The medium of claim 18, wherein the providing at least one result corresponding to the at least one sequence search request input comprises:

applying a data aliasing framework to provide an interlink of a plurality of public data sets to a plurality of private data sets; and formatting at least one result based on the at least one sequence search request input.

* * * * *